United States Patent
Kröner

(10) Patent No.: US 6,620,647 B2
(45) Date of Patent: Sep. 16, 2003

(54) METHOD FOR PRODUCING A SEMICONDUCTOR COMPONENT WITH A SILICON CARRIER SUBSTRATE

(75) Inventor: Friedrich Kröner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/776,963

(22) Filed: Feb. 5, 2001

(65) Prior Publication Data

US 2001/0019853 A1 Sep. 6, 2001

(30) Foreign Application Priority Data

Feb. 3, 2000 (DE) .......................................... 100 04 647

(51) Int. Cl.[7] .......................... H01L 21/44; H01L 21/48; H01L 21/50
(52) U.S. Cl. ....................... 438/107; 438/108; 438/459; 438/613; 438/977
(58) Field of Search ................................ 438/107, 108, 438/459, 613, 977, FOR 343, FOR 378, FOR 485

(56) References Cited

U.S. PATENT DOCUMENTS

| | | | | |
|---|---|---|---|---|
| 4,601,777 A | * | 7/1986 | Hawkins et al. | 216/27 |
| 5,639,693 A | * | 6/1997 | Koseki et al. | 438/107 |
| 5,793,117 A | * | 8/1998 | Shimada et al. | 257/48 |
| 5,989,936 A | * | 11/1999 | Smith et al. | 438/106 |
| 6,090,301 A | * | 7/2000 | Mizukoshi et al. | 216/17 |
| 6,287,890 B1 | * | 9/2001 | Ho | 438/106 |

FOREIGN PATENT DOCUMENTS

| | | | | |
|---|---|---|---|---|
| JP | 63312647 A | * | 12/1988 | H01L/21/52 |

* cited by examiner

Primary Examiner—George Fourson
Assistant Examiner—Michelle Estrada
(74) Attorney, Agent, or Firm—Laurence A. Greenberg; Werner H. Stemer; Gregory L. Mayback

(57) ABSTRACT

Semiconductor chips are mounted on a multilayer wiring of a silicon carrier substrate, while the bottom side of the carrier substrate is provided with soldering contacts in the form of solder balls and is structured in such a way that for each soldering contact a cavity, which extends through the silicon carrier substrate and is filled by the respective solder ball, is formed, so that the solder ball itself makes contact with the multilayer wiring. In this configuration, at least the side walls of the cavity are lined with an insulating material. The insulating layer is applied prior to the application of the multilayer wiring to the structured silicon carrier substrate.

14 Claims, 3 Drawing Sheets

METHOD FOR PRODUCING A SEMICONDUCTOR COMPONENT WITH A SILICON CARRIER SUBSTRATE

BACKGROUND OF THE INVENTION

Field of the Invention

The invention relates to a method for producing a semiconductor component with a multichip module and a silicon carrier substrate.

In the assembly of complex electronic systems with a plurality of semiconductor chips, problems related to packaging technology and connection technology increasingly emerge when reducing the spacing distances between chip connections. The conventional configuration, in which the semiconductor chips are housed individually, provided with connections and then mounted individually on a printed circuit board, is not optimal in many cases due to the relatively high space requirement and due to the wiring required between the individual chips.

What is increasingly common, therefore, is a system configuration in the form of multichip modules, in which a substrate with high-density multilayer wiring, on which the chips are fitted, serves as an intermediate carrier substrate for a joint integration of a plurality of semiconductor chips in a next higher architectural level of the system configuration. Suitable materials for the intermediate carrier substrate nowadays include, in addition to conventional plastic, principally ceramic, metal and silicon. Silicon and ceramic are problematic, however, when combined with the space-saving connection technology BGA (ball grid array), since the holes required for the through-contacting from the multilayer wiring on the mounting side to the already provided solder balls on the underside can be produced only with difficulty for a ceramic substrate, for example.

SUMMARY OF THE INVENTION

It is accordingly an object of the invention to provide a method for producing a semiconductor component having a multichip module, which overcomes the above-mentioned disadvantages of the heretofore-known methods of this general type and which provides a reliable electrical connection between the multilayer wiring and the solder balls.

With the foregoing and other objects in view there is provided, in accordance with the invention, a method for producing a semiconductor component having a multichip module, the method including the steps of:

providing a silicon carrier substrate having cavities formed therein;

applying an insulating layer at least to side walls of the cavities;

applying a multilayer wiring to a mounting side of the silicon carrier substrate; and applying solder balls or solder agglomerations to a bottom side of the silicon carrier substrate such that the solder balls directly contact the multilayer wiring via the cavities, the solder balls providing soldering contacts for electrically connecting a multichip module to a mounting rack.

In other words, the object of the invention is achieved by the steps of:

a) applying the insulation layer to the silicon carrier substrate, b) applying the multilayer wiring to the silicon carrier substrate, and c) applying the solder balls.

According to another mode of the invention, at least one semiconductor chip is provided on the multilayer wiring before or after the step of applying the solder balls, and the at least one semiconductor chip is electrically connected to the multilayer wiring.

According to yet another mode of the invention, a topmost conductor track plane of the multilayer wiring is electrically connected to at least one semiconductor chip.

The fact that the structured silicon carrier substrate, which has already been provided with cavities, is provided with the insulation layer before it is connected to the multilayer wiring allows significantly simpler methods to be used for applying the insulation layer. It is possible to apply at least one semiconductor chip to the multilayer wiring either before or after step c) and to electrically connect this chip to the multilayer wiring.

In one advantageous mode of the invention, the application of the insulation layer includes the following steps:

applying a layer which is resistant to silicon etching at least to that side of the silicon carrier substrate where the solder balls are to be provided at a subsequent step, photolithographically opening the etch-resistant layer and producing cavities which extend through the silicon carrier substrate, removing the etch-resistant layer, and applying an insulation layer at least to the side walls of the cavities.

The etch-resistant layer is advantageously formed of silicon nitride ($Si_3N_4$). Furthermore, it is advantageous for the etch-resistant layer to be applied to both sides of the silicon carrier substrate, and for the cavities which extend through the silicon carrier substrate to be produced by etching until the etch-resistant layer is reached.

The photolithographic opening or structuring of the etch-resistant layer then takes place on that side of the silicon carrier substrate which is remote from the side on which the semiconductor chips are to be applied. The cavities (vertical connections) may be produced, for example, by using a hot caustic potash solution (KOH) until the etch-resistant layer which is on that side of the carrier substrate to which the semiconductor chips are subsequently applied is reached.

The etch-resistant layer may, for example, be removed by using hot phosphoric acid, so that the silicon carrier substrate then has the cavities at the desired locations. The cavities may have inclined flanks or side walls or may have flanks which are at right angles to the main surfaces of the silicon carrier substrate.

Then, the insulating layer is applied to the carrier substrate. According to an advantageous mode of the invention, this is done by dipping the carrier substrate into a material which can be liquefied and hardened. The material is, for example, a ceramic glaze or an epoxy resin. The material which can be liquefied and hardened must have properties such that the viscosity and therefore the layer thickness can be adjusted in such a manner that the holes made in the carrier substrate are not closed again. The hardening of the material can be achieved, for example, by vitrification using a high-temperature process.

In a first mode of the invention, the step of applying the multilayer wiring includes the following steps:

applying a film or foil to the silicon carrier substrate, producing the multilayer wiring, beginning with a metallization, and removing, from the side where the solder balls are to be provided, the film or foil at the locations of the soldering contacts.

The film or foil is applied to that side of the carrier substrate on which the multilayer wiring is provided. The film should be as thin as possible but should be applied in such a manner that it does not "sag" at the locations where the cavities in the carrier substrate are to be found. The multilayer wiring is applied to the film. The metallization, which is connected to the film, must be suitable to form a good mechanical and electrical connection to the solder balls which are subsequently applied. The film can be removed at the locations of the soldering contacts, for example by etching or using an organic solution from that side of the silicon carrier material which is remote from the multilayer wiring. However, the etchant or the solvent must only act on the film or foil, but not on the insulating layer (e.g. ceramic glaze or epoxy resin) which was applied in an earlier step.

According to an alternative mode of the invention, the step of applying the multilayer wiring includes the following steps:

producing the multilayer wiring on an auxiliary substrate,
connecting the multilayer wiring to the silicon carrier substrate, and
removing the auxiliary substrate.

Advantageously, an auxiliary layer is provided between the multilayer wiring and the auxiliary substrate. The auxiliary layer is removed after the multilayer wiring has been connected to the silicon carrier substrate. For this purpose, the auxiliary layer is advantageously formed of a thermally stable plastic which can be dissolved under the action of a solvent. The plastic must be able to withstand the thermal conditions involved in all method steps associated with the multilayer wiring without being damaged. It should dissolve under the action of a solvent, while the multilayer wiring must not be affected by the solvent. Only by dissolving the auxiliary layer can the auxiliary substrate then be detached from the multilayer wiring of the semiconductor component.

Other features which are considered as characteristic for the invention are set forth in the appended claims.

Although the invention is illustrated and described herein as embodied in a method for producing a semiconductor component with a silicon carrier substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings, the invention is described in detail. Problems which have been overcome by the invention are explained with reference to German Patent Application DE 199 30 308.8 which is published after the effective filing date of the instant application and which describes a multichip module with a silicon carrier substrate, multilayer wiring being applied to the mounting side of the substrate. The first, topmost conductor track plane of the wiring makes contact with at least one semiconductor chip which is mounted in each case using flip-chip technology through the use of balls of solder. The underside of the silicon carrier substrate is provided with in particular already provided soldering contacts in the form of solder balls (BGA) which serve to electrically connect the multichip module to a mounting rack. The underside is structured in such a way that for each soldering contact a cavity which narrows in the shape of a funnel from the underside as far as the lowest conductor track plane is formed, the cavity being filled by the respective solder ball, so that the solder ball itself makes contact with the multilayer wiring.

Figure 10:
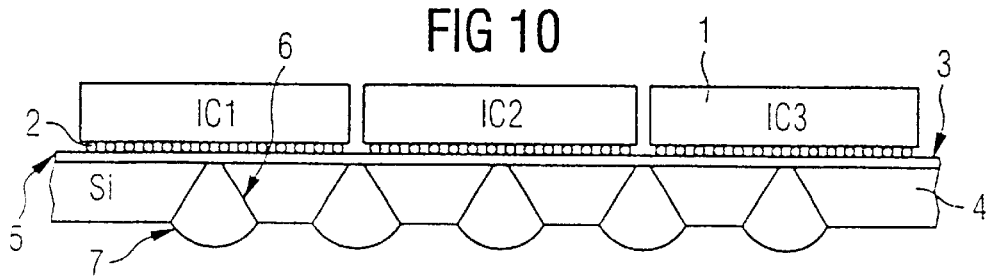
FIG. 10 is a diagrammatic, partial sectional view of a semiconductor component.

FIG. 10 shows, by way of example, three semiconductor chips 1 denoted as IC1, IC2, IC3 which are each soldered by their active side, through the use of balls of solder 2, to the first, topmost conductor track plane 3 of the silicon carrier substrate 4. In a manner known per se, the multilayer wiring 5 is configured as a sequence of structured metal planes which are electrically separated from one another by an organic dielectric. In this configuration, connections are produced between the conductor track planes in a controlled manner using, for example, lithographically produced via holes in the dielectric. Multilayer wiring with alternating Cu/BCB (diphenylcyclobutene) planes is preferred. Naturally, as well as the semiconductor chips 1 illustrated in FIG. 10, further electronic components, by using SMD (surface mounted device) technology, can be soldered to the multilayer wiring 5. The multilayer wiring 5 has a typical thickness of approx. 50 $\mu$m, while the actual silicon carrier substrate 4 may typically be a few 100 $\mu$m thick. FIG. 10 also shows the solder balls 7 which have been inserted into the funnel-shaped cavities 6 and serve as through-plating from the multilayer wiring 5 to the underside of the semiconductor component.

The fabrication of a semiconductor component of this type starts with the application of the multilayer wiring 5 to the silicon carrier substrate 4. In the next fabrication step, the balls of solder 2 are applied to the multilayer wiring 5, preferably by electrodeposition. The structuring of the carrier substrate 4 then takes place, that is to say full development and deep etching, for example using the liquid etchant KOH. Depending on the material properties and thickness of the carrier substrate 4, a desired angle of the funnel in the carrier substrate 4 can be established relatively easily and precisely. As a result, the funnel-shaped cavities 6 are provided, into which solder balls 7 are subsequently introduced mechanically, the cavities 6 resulting in greater stability due to improved lateral retention of the solder balls 7 by comparison with the solder balls which are conventionally fixed only through the use of pads. This is advantageous with regard to the shear forces that occur during thermal expansion. Finally, in a further fabrication step, the semiconductor chips 1 are soldered onto the balls of solder 2 that are already present. This is done, therefore, by flip-chip mounting of the semiconductor chips 1 directly onto the carrier substrate 4. The resulting semiconductor component can be soldered into another assembly through the use of SMD mounting by way of its solder balls 7.

On account of the conductivity of the silicon carrier substrate 4, it is necessary for the inclined sides of the structured cavities 6 (in other words not the bottom of the cavity 6, i.e. the contact with the multilayer wiring 5) to be covered with an insulation layer before the solder balls 7 are introduced. To do this, DE 199 30 308.8 proposes lining the inclined sides of the cavities through the use of a poorly planarizing material, for example photoimide. By contrast, a readily planarizing material would, undesirably, not only cover the inclined sides, that is to say the inner surface of the funnel, but completely fill the latter. If a poorly planarizing material is used as the insulation layer, it is not adequately ensured that only the inclined sides are covered with this material. Therefore, incorrect connections could occur between the solder balls and multilayer wiring 5.

Figure 1:
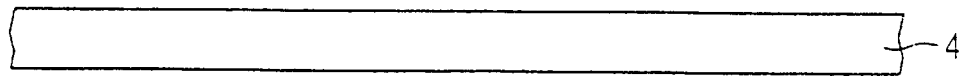
FIGS. 1 to 6 are diagrammatic, partial sectional views of the silicon carrier substrate illustrating successive production steps up to the application of the insulating layer to the silicon carrier substrate.
Figure 2:
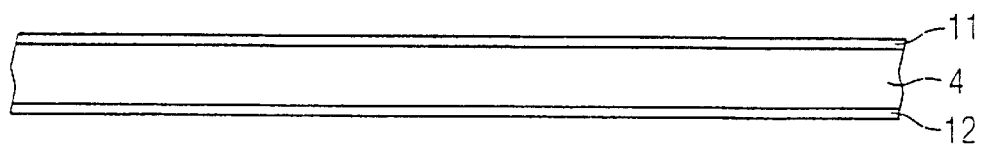
Figure 3:
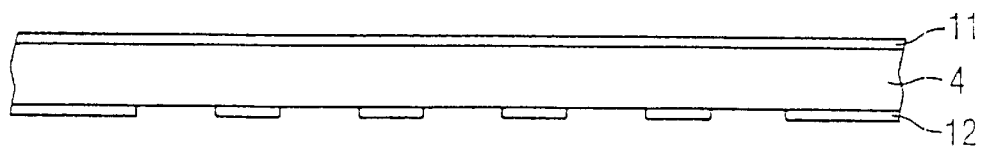
Figure 4:
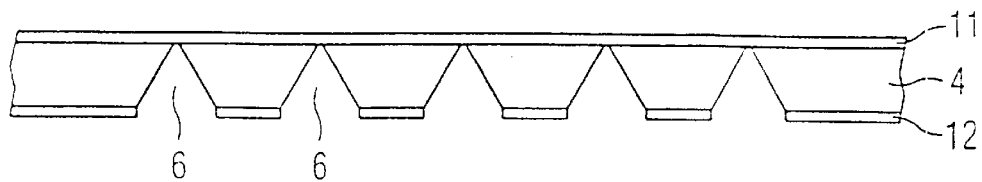
Figure 5:
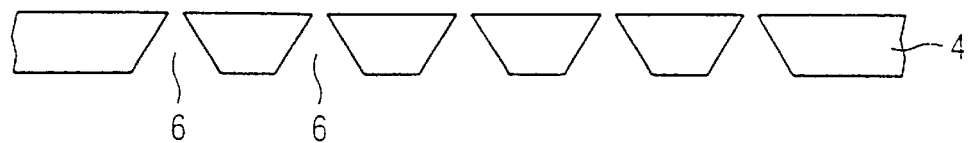
Figure 6:
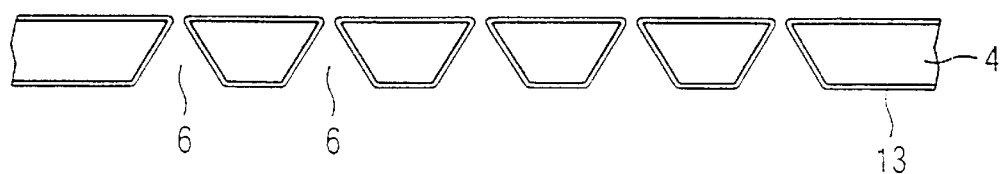
Figure 7:
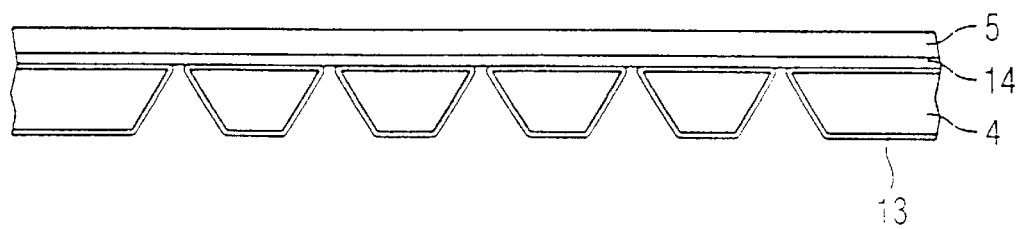
FIGS. 7 to 9 are diagrammatic, partial sectional views of the silicon carrier substrate and the multilayer wiring illustrating successive production steps according to a first variant of the method according to the invention.

According to the invention, this problem is overcome by the method described with reference to FIGS. 1 to 9 which show, in temporally successive production steps, a first variant of the method according to the invention for the production of a semiconductor component. A silicon carrier substrate 4 is illustrated in FIG. 1. An etch-resistant layer 11, 12 is applied to each of the two principal surfaces of the silicon carrier layer or silicon carrier substrate 4 (FIG. 2). On the principal side, on which the soldering contacts are subsequently to be provided, the etch-resistant layer, in the present example the layer 12, is photomasked. The etch-resistant layers 11, 12 in this case preferably consist of silicon nitride. After the photomasking, openings are made in the etch-resistant layer 12, preferably using plasma etching, at the locations of the subsequent soldering contacts (FIG. 3). Then, the vertical connects (cavities 6) are etched into the silicon carrier layer. The cavities, which can be produced, for example, using hot caustic potash solution, are introduced into the carrier layer 4 until the etch-resistant layer 11 is reached. Semiconductor chips are subsequently applied to the principal side, to which the etch-resistant layer 11 is applied. In FIG. 4, the cavities 6 have inclined flanks (side walls). Naturally, it would also be conceivable to provide cylindrical recesses in the carrier layer 4. In the next method step, which is illustrated in FIG. 5, the etch-resistant layers 11, 12 are removed on both principal sides of the carrier layer 4.

In this state, all that remains is the silicon carrier layer 4 with the cavities 6.

Then, an insulating layer, for example of a ceramic glaze or an epoxy resin, is applied. This advantageously takes place through the use of a dipping method, so that the entire surface of the carrier layer 4 is covered by the insulating layer 13. The layer thickness can be adjusted through the use of the viscosity of the insulating layer, in such a manner that the continuous cavities in the carrier layer 4 are not closed up again.

Figure 8:
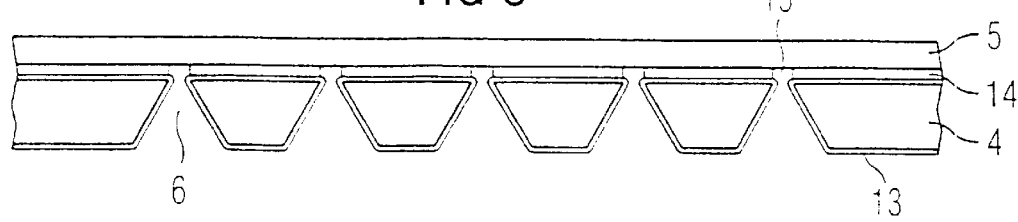
Figure 9:
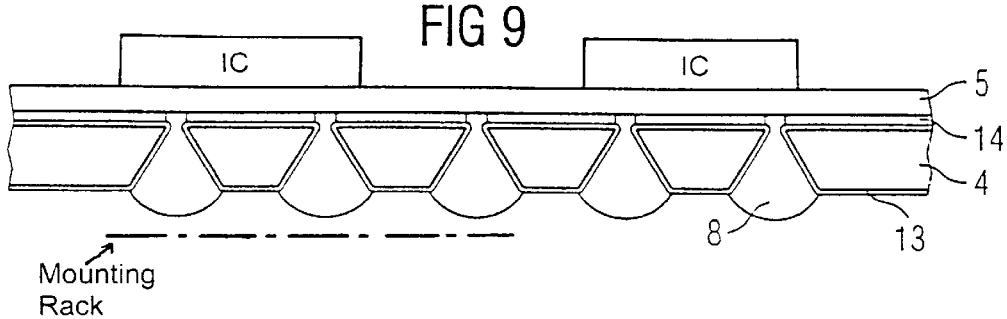

In the next method step, a film or foil 14 is applied to that side of the carrier layer 4 which is remote from the subsequent solder balls. The multilayer wiring 5 is provided on this film. The first sequence of the multilayer wiring contains a metallization which is directly connected to the film 14. Preferably, four conductor track planes are applied to the silicon carrier substrate 4. The cavities 6 are provided for receiving solder balls. To be able to produce an electrical connection between these solder balls and the first metallization of the multilayer wiring 5, the film 14 is removed at regions 15, wherein the removal step is performed from the side where the solder balls are to be provided at a later step. The removal may take place, for example, by etching or using an organic solution. This fabrication step is illustrated in FIG. 8. FIG. 9 then shows the solder balls 8 which have been introduced into the cavities 6. Before or after the application of the solder balls 8, at least one semiconductor chip IC can be applied to the multilayer wiring 5. This chip may, for example, as shown in FIG. 10, be electrically connected to a metallization of the multilayer wiring through the use of flip-chip contacting or through the use of conventional bond wiring. The solder balls provide soldering contacts for electrically connecting the multichip module to a mounting rack which is schematically illustrated as a dash-dotted line.

Figure 11:
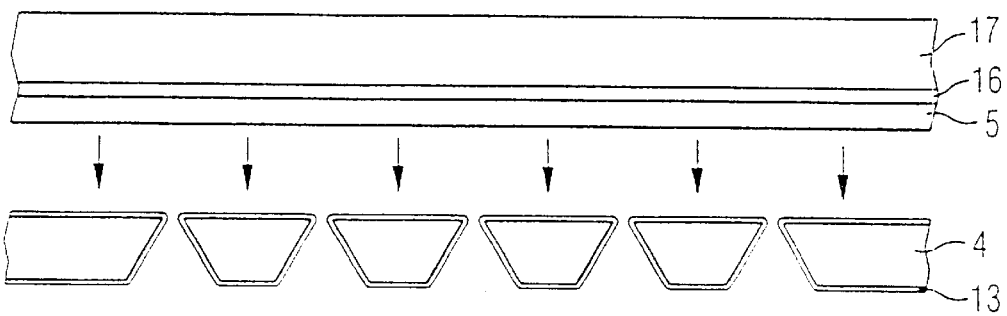
FIGS. 11 and 12 are diagrammatic, partial sectional views of the silicon carrier substrate and the multilayer wiring illustrating successive production steps according to a second variant of the method according to the invention.
Figure 12:
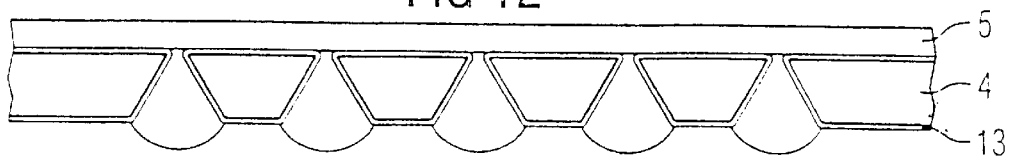

FIGS. 11 and 12 show an alternative variant for connecting the multilayer wiring 5 to the carrier layer 4, which has already been provided with the insulating layer 13. To do this, the multilayer wiring 5 has been connected, via an auxiliary layer 16, to an auxiliary substrate 17, e.g. a semiconductor wafer. The auxiliary substrate 17 serves only as an auxiliary carrier for producing the multilayer wiring 5. Then, this assembly is connected to the silicon carrier layer 4. This can be achieved, for example, using a hot-melt adhesive, the softening point of which is higher than the temperature at which the auxiliary layer 16 becomes detached. Systems of this type are known from double-sided adhesive films/foils for the technology of carrier wafers. Fluorophosphate glass materials with a very low softening point are an alternative substance for producing the connection. The auxiliary structure 17 may be effected either by dissolution of the auxiliary layer 16 or by wet-chemical etching of both the auxiliary layer and the auxiliary substrate 17.

The separate production of the carrier substrate and of the multilayer wiring and the subsequent connection of these two components allows a particularly simple and time-saving production method for a semiconductor component with a multilayer thin-film structure.

I claim:

1. A method for producing a semiconductor component having a multichip module, the method which comprises:
    providing a silicon carrier substrate having two sides, one of said sides being a mounting side and the other of said aides being a bottom side, said silicon carrier having cavities formed therein extending from the bottom side through to the mounting side;
    applying an insulating layer at least to side walls of the cavities;
    applying a multilayer wiring to the mounting side of the silicon carrier substrate; and
    applying solder balls to the bottom side of the silicon carrier substrate causing the solder balls to directly contact the multilayer wiring through the cavities.

2. The method according to claim 1, which comprises:
    providing at least one semiconductor chip on the multilayer wiring prior to the step of applying the solder balls; and
    electrically connecting the at least one semiconductor chip to the multilayer wiring.

3. The method according to claim 1, which comprises:
    providing at least one semiconductor chip on the multilayer wiring after the step of applying the solder balls; and
    electrically connecting the at least one semiconductor chip to the multilayer wiring.

4. The method according to claim 1, which comprises electrically connecting a topmost conductor track plane of the multilayer wiring to at least one semiconductor chip.

5. The method according to claim 1, which comprises:
    applying an etch-resistant layer at least at the bottom side of the silicon carrier layer, the etch-resistant layer being resistant to silicon etching;

photomasking the etch-resistant layer and producing the cavities such that the cavities extend through the silicon carrier layer; and removing the etch-resistant layer prior to the step of applying the insulating layer.

6. The method according to claim 5, which comprises using an $Si_3N_4$ layer as the etch-resistant layer.

7. The method according to claim 5, which comprises:

applying the etch-resistant layer on both sides of the silicon carrier layer; and producing the cavities by etching through the silicon carrier layer until the etch-resistant layer is reached.

8. The method according to claim 1, which comprises applying the insulating layer by dipping the silicon carrier substrate into a material which can be liquefied and hardened.

9. The method according to claim 1, which comprises using, as the insulating layer, a material selected from the group consisting of a ceramic glaze and an epoxy resin.

10. The method according to claim 1, wherein the step of applying the multilayer wiring includes:

applying a film to the silicon carrier substrate;

producing the multilayer wiring by first providing a metallization; and removing the film at locations at which the solder balls are to make electrical contact with the multilayer wiring.

11. The method according to claim 1, wherein the step of applying the multilayer wiring includes:

producing the multilayer wiring on an auxiliary substrate;

connecting the multilayer wiring to the silicon carrier substrate; and removing the auxiliary substrate.

12. The method according to claim 11, which comprises:

providing an auxiliary layer between the multilayer wiring and the auxiliary substrate; and removing the auxiliary layer subsequent to the step of connecting the multilayer wiring to the silicon carrier substrate.

13. The method according to claim 12, which comprises using, as the auxiliary layer, a thermally stable plastic which can be dissolved with a solvent.

14. The method according to claim 1, which further comprises electrically connecting the multichip module to a mounting rack using the solder balls for providing soldering contacts.

* * * * *